United States Patent
Ooyabu et al.

(10) Patent No.: US 8,716,733 B2
(45) Date of Patent: May 6, 2014

(54) TRANSFER SHEET FOR PHOSPHOR LAYER AND LIGHT-EMITTING DEVICE

(75) Inventors: Yasunari Ooyabu, Ibaraki (JP); Satoshi Sato, Ibaraki (JP); Hisataka Ito, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 145 days.

(21) Appl. No.: 13/167,331

(22) Filed: Jun. 23, 2011

(65) Prior Publication Data

US 2011/0316031 A1 Dec. 29, 2011

(30) Foreign Application Priority Data

Jun. 29, 2010 (JP) .................................. 2010-147758

(51) Int. Cl.
*H01L 33/50* (2010.01)

(52) U.S. Cl.
USPC ........... 257/98; 257/E33.061; 257/91; 257/99

(58) Field of Classification Search
USPC ................. 257/98, E33.061, 91, 99
See application file for complete search history.

(56) References Cited

U.S. PATENT DOCUMENTS

| 2004/0145308 A1 | 7/2004 | Rossner et al. |
| 2006/0012299 A1* | 1/2006 | Suehiro et al. ................. 313/512 |
| 2007/0004065 A1* | 1/2007 | Schardt et al. .................. 438/26 |
| 2008/0137331 A1 | 6/2008 | Kaneko et al. |
| 2010/0295070 A1* | 11/2010 | Su et al. .......................... 257/91 |

FOREIGN PATENT DOCUMENTS

| JP | 2003-046133 A | 2/2003 |
| JP | 2004-146835 A | 5/2004 |
| JP | 2006-005367 A | 1/2006 |
| JP | 2008-147453 A | 6/2008 |
| JP | 2008-187089 A | 8/2008 |
| JP | 2009-229507 | 10/2009 |

OTHER PUBLICATIONS

Notice of Reasons for Refusal issued in corresponding JP Application No. 2010-147758, dispatched on Aug. 6, 2013.

* cited by examiner

*Primary Examiner* — Marc Armand
(74) *Attorney, Agent, or Firm* — Sughrue Mion, PLLC

(57) ABSTRACT

A transfer sheet for a phosphor layer includes a release substrate, a phosphor layer formed on the release substrate, and an adhesive layer formed on the phosphor layer.

5 Claims, 4 Drawing Sheets

FIG.2
(a)
(b)
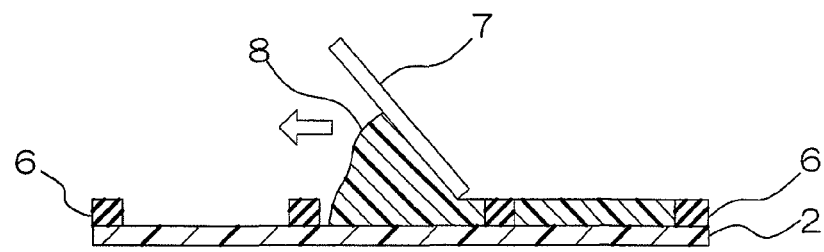
(c)
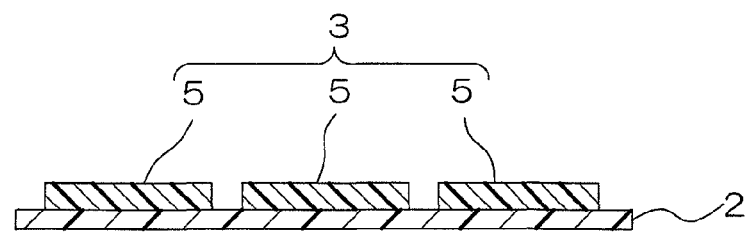
(d)
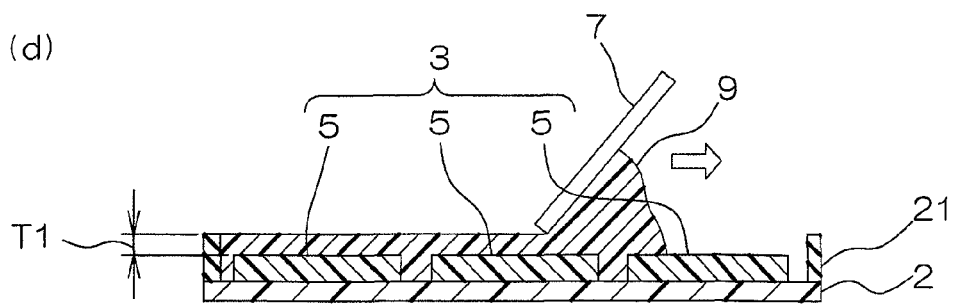
(e)
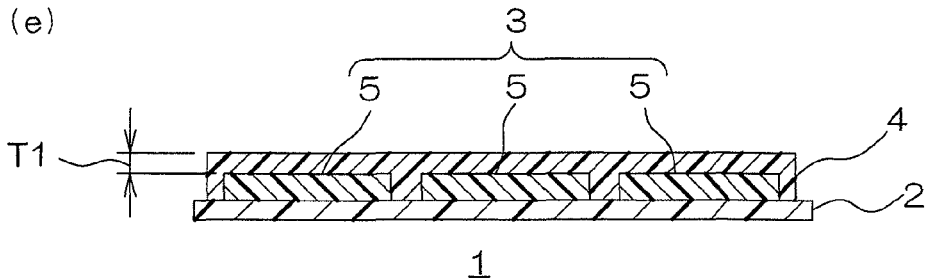

FIG.3
(a) 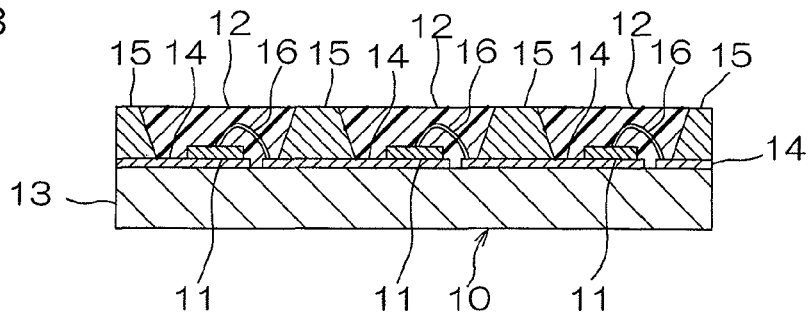
(b) 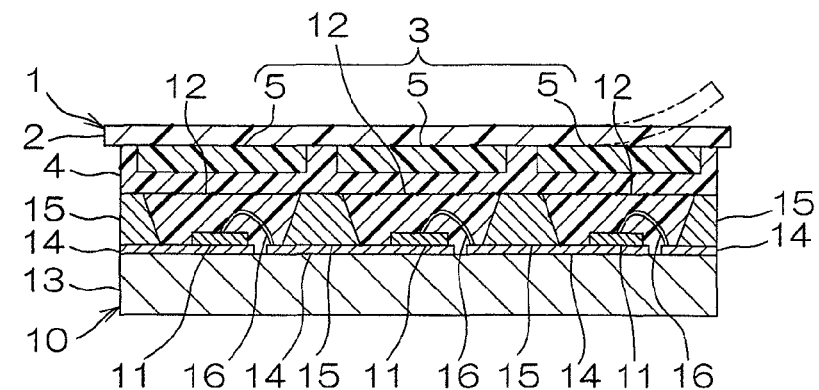
(c) 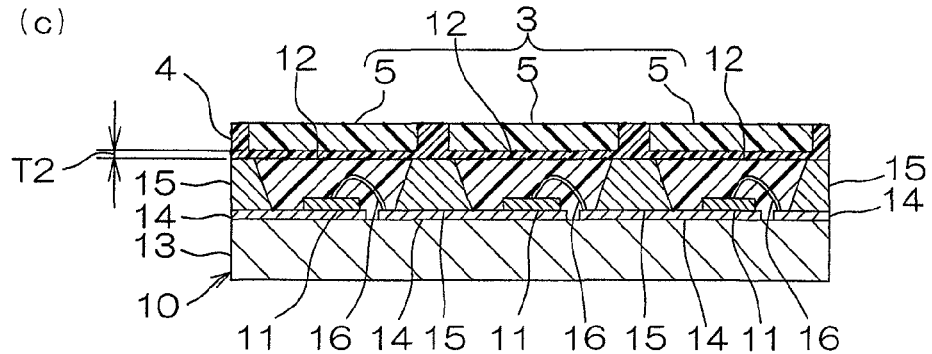
(d) 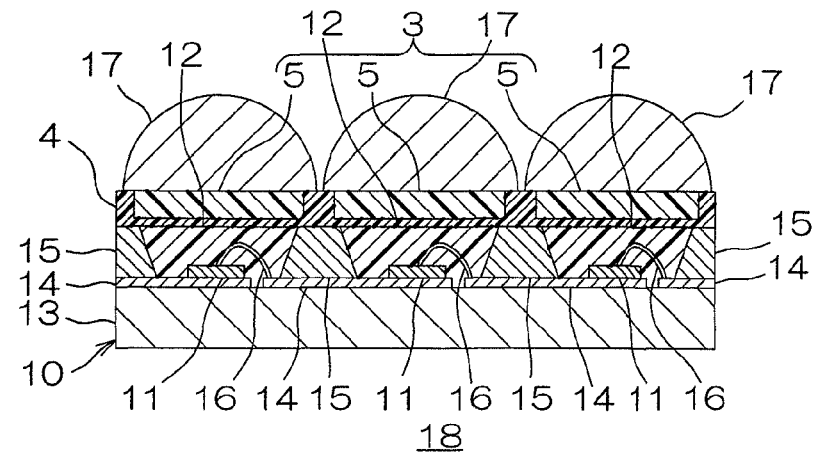

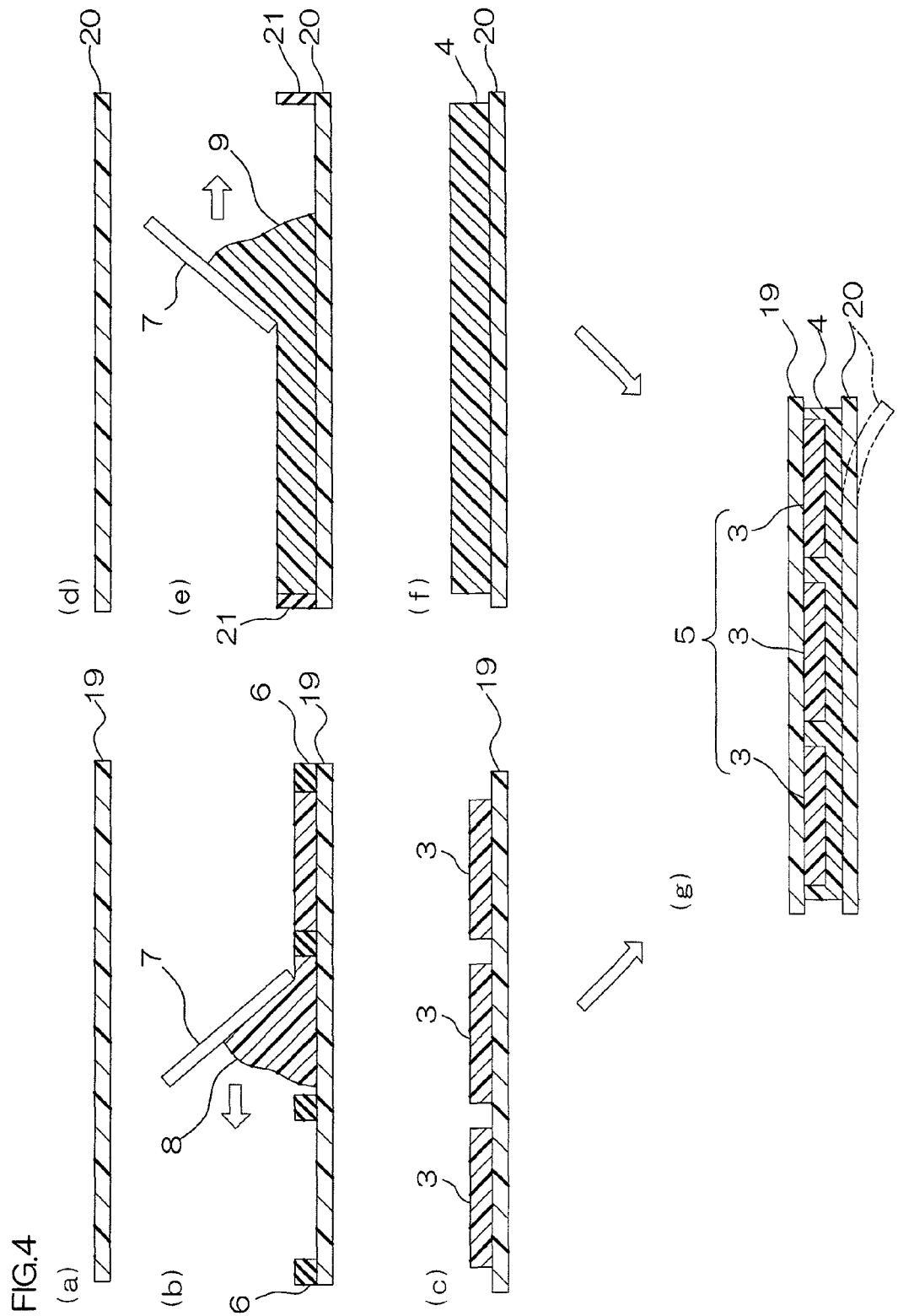

TRANSFER SHEET FOR PHOSPHOR LAYER AND LIGHT-EMITTING DEVICE

CROSS-REFERENCE TO RELATED APPLICATION

The present application claims priority from Japanese Patent Application No. 2010-147758 filed on Jun. 29, 2010, the contents of which are hereby incorporated by reference into this application.

BACKGROUND OF THE INVENTION

1. Field of the Invention

The present invention relates to a transfer sheet for a phosphor layer and a light-emitting device, to be specific, to a light-emitting device preferably used as a white light-emitting device; and a transfer sheet for a phosphor layer used in the fabrication thereof.

2. Description of Related Art

In recent years, as a light-emitting device that is capable of emitting high-energy light, a white light-emitting device has been known. In the white light-emitting device, for example, a LED (light emitting diode) that emits blue light and a phosphor layer that can convert blue light into yellow light are provided and the white light-emitting device emits high-energy white light by color mixing of the blue light emitted from the LED and the yellow light converted from the blue light in the phosphor layer.

There has been proposed that, as the white light-emitting device, for example, in a mounted board in which a recess that is open upward is formed, a resin sheet containing a phosphor is provided so as to cover the upper end (opening edge) of the recess while a blue LED chip is provided on the bottom surface of the recess (ref: for example, Japanese Unexamined Patent Publication No. 2003-46133).

To provide the resin sheet described in Japanese Unexamined Patent Publication No. 2003-46133 on the mounted board, an adhesive is first laminated on the upper surface of the opening edge of the recess on the mounted board. Next, the resin sheet containing the phosphor is laminated on the upper surface of the adhesive.

SUMMARY OF THE INVENTION

However, in a setting method of the resin sheet proposed in Japanese Unexamined Patent Publication No. 2003-46133, it is necessary to first form an adhesive layer on the mounted board, and then to adhere the resin sheet onto the mounted board via the adhesive layer. Thus, the production process increases to become complicated and require additional work.

It is an object of the present invention to provide a transfer sheet for a phosphor layer that is capable of providing a phosphor layer easily; and a light-emitting device that can be obtained with excellent production costs by allowing the phosphor layer to be transferred using the transfer sheet for the phosphor layer.

A transfer sheet for a phosphor layer of the present invention includes a release substrate, a phosphor layer formed on the release substrate, and an adhesive layer formed on the phosphor layer.

In the transfer sheet for the phosphor layer of the present invention, it is preferable that the phosphor layer includes a plurality of phosphor portions that are arranged in alignment in spaced relation to each other and the adhesive layer is in contact with the upper surface of the release substrate among each of the phosphor portions.

In the transfer sheet for the phosphor layer of the present invention, it is preferable that the refractive index of the adhesive layer is higher than that of the phosphor layer.

A light-emitting device of the present invention includes a board, a light emitting diode provided on the board, and a phosphor layer provided on the board so as to cover the light emitting diode, wherein the phosphor layer is adhered onto the board via an adhesive layer by allowing the phosphor layer to be transferred on the board using a transfer sheet for a phosphor layer including a release substrate, the phosphor layer formed on the release substrate, and the adhesive layer formed on the phosphor layer.

According to the transfer sheet for the phosphor layer of the present invention, the phosphor layer can be easily adhered to the board via the adhesive layer by an easy method of transferring the phosphor layer on the board.

Therefore, the light-emitting device of the present invention can be obtained by an easy method with excellent production costs.

BRIEF DESCRIPTION OF THE DRAWINGS

FIG. 2 shows process drawings for fabricating the transfer sheet for the phosphor layer:
(a) illustrating a step of preparing a release substrate,
(b) illustrating a step of applying a phosphor composition onto the release substrate,
(c) illustrating a step of forming a phosphor layer,
(d) illustrating a step of applying an adhesive composition onto the release substrate, and
(e) illustrating a step of forming an adhesive layer.

FIG. 3 shows process drawings for fabricating a light-emitting device of an embodiment of the present invention:
(a) illustrating a step of preparing a board and a light emitting diode,
(b) illustrating a step of transferring the phosphor layer on the board by the transfer sheet for the phosphor layer,
(c) illustrating a step of curing the adhesive layer, and
(d) illustrating a step of providing lenses on phosphor portions.

FIG. 4 shows other process drawings for fabricating the transfer sheet for the phosphor layer:
(a) illustrating a step of preparing a first release substrate,
(b) illustrating a step of applying the phosphor composition onto the first release substrate,
(c) illustrating a step of forming the phosphor layer,
(d) illustrating a step of preparing a second release substrate,
(e) illustrating a step of applying the adhesive composition onto the second release substrate,
(f) illustrating a step of forming the adhesive layer, and
(g) illustrating a step of sticking the phosphor layer and the adhesive layer together.

DETAILED DESCRIPTION OF THE INVENTION

Figure 1:
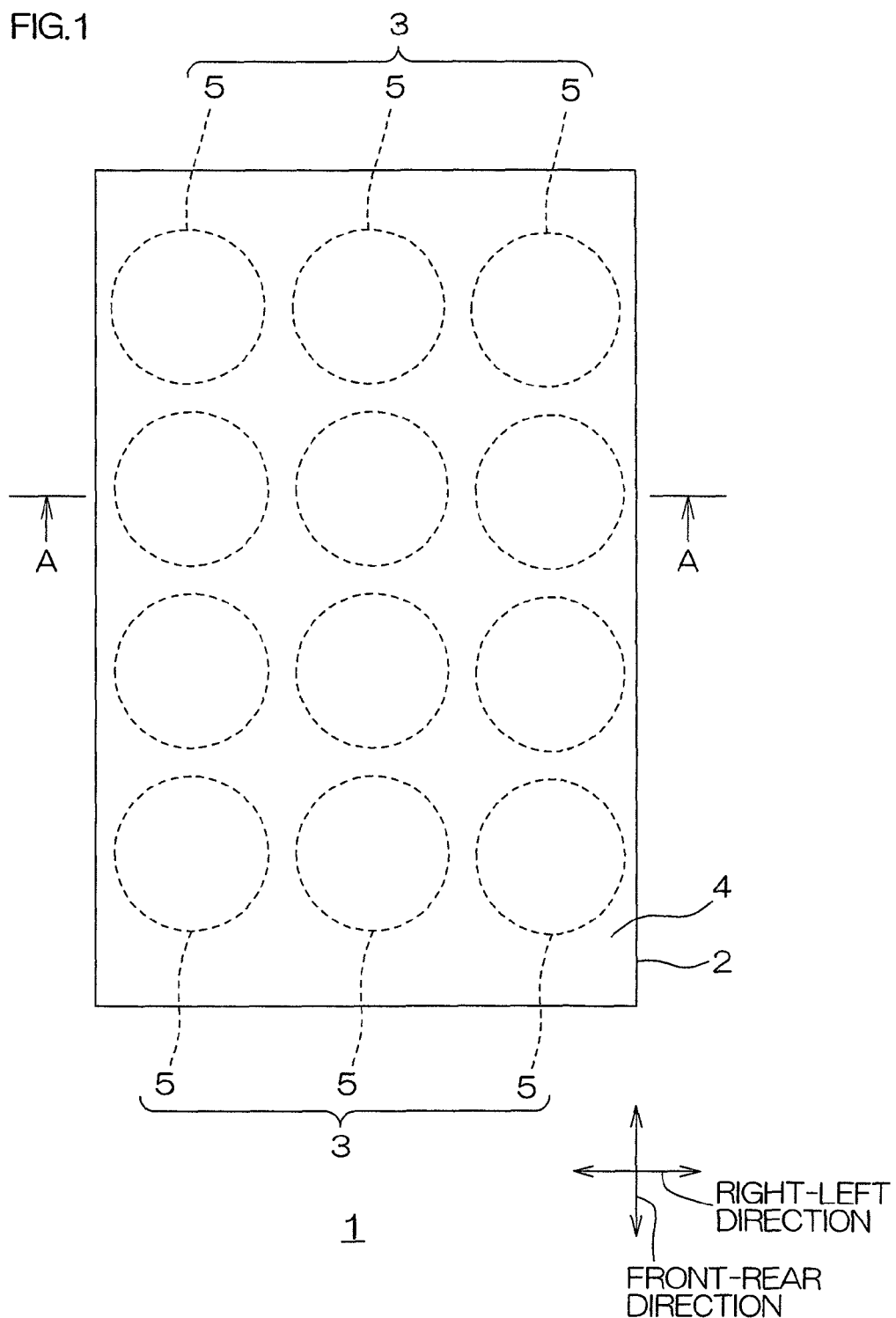
FIG. 1 shows a plan view of a transfer sheet for a phosphor layer of an embodiment of the present invention.

FIG. 1 shows a plan view of a transfer sheet for a phosphor layer of an embodiment of the present invention. FIG. 2 shows process drawings for fabricating the transfer sheet for the phosphor layer. FIG. 3 shows process drawings for fabricating a light-emitting device of an embodiment of the present invention. In FIG. 1, the up-down direction of the paper surface is referred to as the front-rear direction and the right-left direction of the paper surface is referred to as the right-left direction for descriptive purposes.

In FIG. 1 and FIG. 2(e), a transfer sheet for a phosphor layer 1 is formed into a generally rectangular flat plate shape and includes a release substrate 2, a phosphor layer 3 formed on the release substrate 2, and an adhesive layer 4 formed on the phosphor layer 3.

The release substrate 2 is formed so as to correspond to the outer shape of the transfer sheet for the phosphor layer 1 in plane view and to be specific, is formed into a generally rectangular flat plate sheet shape.

To be specific, examples of the material for forming the release substrate 2 include resin materials such as polyethylene, polypropylene, and polyethylene terephthalate; and metal materials such as iron, aluminum, and stainless steel. The resin materials are preferably used.

Furthermore, the surface (the upper surface) of the release substrate 2 is subjected to release treatment such as silicone treatment, long-chain alkyl treatment, or fluorine treatment and the like as required so as to improve the release characteristics from the phosphor layer 3 and the adhesive layer 4.

The thickness of the release substrate 2 is in the range of, for example, 10 to 1000 μm, or preferably 50 to 500 μm.

The phosphor layer 3 is formed on the upper surface of the release substrate 2 and includes a plurality of phosphor portions 5 that are arranged in alignment in spaced relation to each other.

Each of the phosphor portions 5 are arranged in spaced relation to each other in the direction perpendicular to the thickness direction of the transfer sheet for the phosphor layer 1, that is, in the plane direction of the release substrate 2, and to be specific, in the front-rear direction and the right-left direction thereof. In FIG. 1, the phosphor portions 5 are arranged in alignment, for example, in a pattern of four rows in the front-rear direction and three rows in the right-left direction.

The phosphor portions 5 are formed into a generally circular shape in plane view.

The phosphor layer 3 is formed, for example, from a phosphor composition containing a phosphor.

The phosphor composition preferably contains a phosphor and a resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide or a metal sulfide and the like.

To be specific, examples of the phosphor include garnet type phosphor having a garnet type crystal structure such as $Y_3Al_5O_{12}$:Ce (YAG (yttrium aluminum garnet):Ce), $(Y, Gd)_3Al_5O_{12}$:Ce, $Tb_3Al_5O_{12}$:Ce, $Ca_3Sc_2Si_3O_{12}$:Ce, and $Lu_2CaMg_2(Si, Ge)_3O_{12}$:Ce; silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$:Mn and $SrAl_2O_4$:Eu; sulfide phosphor such as ZnS:Cu,Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlON; nitride phosphor such as $CaAlSiN_3$:Eu and $CaSi_5N_8$:Eu; and fluoride-based phosphor such as $K_2SiF_6$:Mn and $K_2TiF_6$:Mn. Preferably, garnet type phosphor is used, or more preferably, $Y_3Al_5O_{12}$:Ce is used.

The above-described phosphor is in the form of particle and the average particle size thereof is in the range of, for example, 0.1 to 30 μm, or preferably 0.2 to 10 μm. The average particle size of the phosphor layer is measured by a particle size distribution measurement device.

The phosphor can be used alone or in combination of two or more.

The mixing ratio of the phosphor is, for example, 1 to 50 weight %, or preferably 5 to 30 weight % with respect to the phosphor composition. The mixing ratio of the phosphor is, for example, 1 to 100 parts by mass, or preferably 5 to 40 parts by mass per 100 parts by mass of the resin.

The resin is a matrix in which the phosphor is dispersed, including, for example, transparent resins such as silicone resin, epoxy rein, and acrylic resin.

The silicone resin is preferably used from the viewpoint of durability.

The silicone resin has, in its molecule, a main chain mainly composed of the siloxane bond (—Si—O—Si—) and a side chain in which an organic group such as an alkyl group (for example, methyl group, and the like) or an alkoxyl group (for example, methoxy group) is attached to silicon atoms (Si) of the main chain.

To be specific, examples of the silicone resin include dehydration condensation type silicone resin, addition reaction type silicone resin, peroxide curable silicone resin, moisture curable silicone resin, and curable silicone resin. The addition reaction type silicone resin is preferably used.

The silicone resin has a kinetic viscosity at 25° C. in the range of, for example, 10 to 30 mm$^2$/s.

The resin can be used alone or in combination of two or more.

The mixing ratio of the resin is, for example, 50 to 99 mass %, or preferably 70 to 95 mass % with respect to the phosphor composition.

The phosphor and the resin are blended at the above-described mixing ratio and are stirred and mixed, thereby preparing a phosphor composition.

The refractive index n1 of the phosphor layer 3 is in the range of, for example, 1.30 to 1.50, or preferably 1.35 to 1.45. The refractive index n1 of the phosphor layer 3 is measured in conformity with the description of JIS K 7142.

The thickness of the phosphor layer 3 is in the range of, for example, 20 to 500 μm, or preferably 50 to 300 μm.

The adhesive layer 4 is formed so as to correspond to the outer shape of the transfer sheet for the phosphor layer 1 and to be specific, is formed so as to expose the circumference end portions of the release substrate 2. That is, the adhesive layer 4 is formed into a generally flat plate sheet shape so as to cover the surface of the phosphor layer 3 and the surface (except for the circumference end portions) of the release substrate 2 exposed from the phosphor layer 3. To be specific, the adhesive layer 4 is in contact with the surfaces (the upper surfaces and the peripheral side surfaces) of each of the phosphor portions 5 and the surface (the upper surface) of the release substrate 2 among each of the phosphor portions 5.

The adhesive layer 4 is formed from adhesive composition such as an epoxy adhesive composition, a silicone adhesive composition, a urethane adhesive composition or an acrylic adhesive composition. Of the adhesive compositions, preferably, an epoxy adhesive composition and a silicone adhesive composition are used, or more preferably an epoxy adhesive composition is used.

The epoxy adhesive composition contains, for example, an epoxy resin and a curing agent.

Examples of the epoxy resin include aromatic epoxy resins such as bisphenol epoxy resin (for example, bisphenol A epoxy resin, bisphenol F epoxy resin, hydrogenated bisphenol A epoxy resin, and the like) and novolak epoxy resin (for example, phenol novolak epoxy resin, and the like); nitrogen-containing-cyclic epoxy resins such as triepoxypropyl isocyanurate (triglycidyl isocyanurate) and hydantoin epoxy resin; aliphatic epoxy resin; alicyclic epoxy resin such as dicyclo ring-type epoxy resin, and the like; glycidylether epoxy resin such as ethylene glycol diglycidyl ether and polyethylene glycol diglycidyl ether; and triazine epoxy resin.

The epoxy resin has an epoxy equivalent of, for example, 100 to 1200 g/eqiv. The epoxy equivalent is measured in accordance with JIS K 7236 (2001).

The epoxy resin has a viscosity at 25° C. of, for example, 800 to 6000 mPa·s.

These epoxy resins can be used alone or in combination of two or more.

The curing agent is a latent curing agent (epoxy resin curing agent) that can cure the epoxy resin by heating, and examples thereof include an imidazole compound, an amine compound, an acid anhydride compound, an amide compound, a hydrazide compound, and an imidazoline compound.

Examples of the imidazole compound include 2-phenyl imidazole, 2-methyl imidazole, and 2-ethyl-4-methyl imidazole.

Examples of the amine compound include polyamines such as ethylene diamine, propylene diamine, diethylene triamine, triethylene tetramine, and amine adducts thereof; metha phenylenediamine; diaminodiphenyl methane; and diaminodiphenyl sulfone.

Examples of the acid anhydride compound include phthalic anhydride, maleic anhydride, tetrahydrophthalic anhydride, hexahydrophthalic anhydride, 4-methyl-hexahydrophthalic anhydride, methyl nadic anhydride, pyromelletic anhydride, dodecenylsuccinic anhydride, dichloro succinic anhydride, benzophenone tetracarboxylic anhydride, and chlorendic anhydride.

Examples of the amide compound include dicyandiamide and polyamide.

An example of the hydrazide compound includes adipic acid dihydrazide.

Examples of the imidazoline compound include methylimidazoline, 2-ethyl-4-methylimidazoline, ethylimidazoline, isopropylimidazoline, 2,4-dimethylimidazoline, phenylimidazoline, undecylimidazoline, heptadecylimidazoline, and 2-phenyl-4-methylimidazoline.

These curing agents can be used alone or in combination of two or more.

The mixing ratio of the curing agent is, depending on the equivalent ratio of the curing agent to the epoxy resin, for example, 1 to 30 parts by weight per 100 parts by weight of the epoxy resin.

The above-described epoxy resin and curing agent are blended at the above-described mixing ratio and are stirred and mixed, thereby preparing an epoxy adhesive composition.

The refractive index n2 of the adhesive layer 4 is in the range of, for example, 1.35 to 1.65, or preferably 1.41 to 1.58.

The refractive index n2 of the adhesive layer 4 is higher than the refractive index n1 of the phosphor layer 3. To be specific, the refractive index n2 of the adhesive layer 4 is set to be higher by 0.05 to 0.30, or preferably 0.10 to 0.20 than the refractive index n1 of the phosphor layer 3.

When the refractive index n2 of the adhesive layer 4 is higher than the refractive index n1 of the phosphor layer 3, the light extraction efficiency of the light emitted from a light-emitting device 18 (described later) can be improved.

The refractive index n2 of the adhesive layer 4 is measured in conformity with the description of JIS K 7142.

The thickness T1 of the adhesive layer 4, that is, the height T1 from the upper surface of the phosphor layer 3 to the upper surface of the transfer sheet for the phosphor layer 1 is in the range of, for example, 1 to 1000 µm, or preferably 10 to 100 µm.

To fabricate the transfer sheet for the phosphor layer 1, as shown in FIG. 2(a), the release substrate 2 is first prepared.

Next, as shown in FIG. 2(b), a phosphor composition 8 is applied onto the release substrate 2. A solvent such as toluene can be blended into the phosphor composition 8 at an appropriate ratio so as to adjust the viscosity thereof as required.

In the application of the phosphor composition 8, for example, the printing method is used. In the printing method, for example, a screen 6 that is formed in a pattern reverse to the pattern of the phosphor portions 5 is placed on the release substrate 2. Next, the phosphor composition 8 is printed with a squeegee 7 via the screen 6. In the printing method, the upper surfaces of each of the phosphor portions 5 are flush with the upper end surface of the screen 6 to become flat, so that the phosphor composition 8 can be applied evenly and easily.

Thereafter, after the solvent is removed by heating as required, the screen 6 is lifted from the release substrate 2, so that as shown in FIG. 2(c), the phosphor layer 3 including a plurality of the phosphor portions 5 is formed.

Next, as shown in FIG. 2(d), an adhesive composition 9 is applied onto the release substrate 2 so as to cover the phosphor layer 3. A solvent such as carbitol acetate can be blended into the adhesive composition 9 at an appropriate ratio so as to adjust the viscosity thereof as required.

In the application of the adhesive composition 9, for example, the printing method or the coating method is used. The printing method is preferably used. In the printing method, for example, a frame member 21 is placed on the circumference end portions of the release substrate 2. Next, the adhesive composition 9 is printed with the squeegee 7. In the printing method, the upper surface of the adhesive layer 4 is flush with the upper end surface of the frame member 21 to become flat, so that the adhesive composition 9 can be applied evenly and easily.

Thereafter, after the solvent is removed by heating as required, the frame member 21 is lifted from the release substrate 2, so that as shown in FIG. 2(e), the adhesive layer 4 is formed.

The transfer sheet for the phosphor layer 1 can be obtained in this manner.

Next, a method for fabricating a light-emitting device 18 using the transfer sheet for the phosphor layer 1 is described with reference to FIG. 3.

In this method, as shown in FIG. 3(a), a board 10 and a light emitting diode 11 provided thereon are first prepared.

The board 10 includes a base board 13, a conductive pattern 14 formed on the upper surface of the base board 13, and a housing 15 provided to stand upward from the upper surface of the base board 13.

The base board 13 is formed into a generally rectangular flat plate shape in plane view and is formed from a known insulating resin such as a polyimide resin and the like.

The conductive pattern 14 electrically connects a terminal of the light emitting diode 11 to a terminal (not shown) of a power source for supplying electric power to the light emitting diode 11. The conductive pattern 14 is formed from a conductive material such as copper, iron and the like.

The housing 15 is arranged so as to surround the light emitting diode 11 to be described later one by one in plane view and is formed into a generally trapezoidal shape in sectional view in which the width thereof gradually becomes narrower as going upward. In this way, the housing 15 separates the region that houses the light emitting diode 11 to be described later. A plurality of the light emitting diodes 11 are arranged in alignment, so that the housing 15 is formed into a generally grid shape in plane view.

The region separated by the housing 15 is formed into a generally circular shape that is a little smaller than the phosphor portion 5 in plane view.

An example of the light emitting diode 11 includes a blue light emitting diode (blue LED) that mainly emits blue light.

A plurality of the light emitting diodes 11 are provided on the base board 13. Each of the light emitting diodes 11 is provided in the regions separated by the housing 15 and is electrically connected (wire bonding) to the conductive pattern 14 via a wire 16.

On the base board 13, a sealing layer 12 is filled in the regions separated by the housing 15, so that the light emitting diodes 11 are sealed. The sealing layer 12 is formed from a known sealing resin and the upper surface thereof is formed to be flush with the upper surface of the housing 15 in the thickness direction.

Next, in this method, as shown in FIG. 3(b), the phosphor layer 3 is transferred on the board 10 using the above-described transfer sheet for the phosphor layer 1.

To be specific, the surface (the lower surface (the back surface) in FIG. 3(b) and the upper surface in FIG. 2(e)) of the adhesive layer 4 of the transfer sheet for the phosphor layer 1 is allowed to come into contact with the surface (the upper surface) of the housing 15 on the board 10 and the surface (the upper surface) of the sealing layer 12.

In this way, the phosphor layer 3 is attached to the upper surfaces of the housing 15 and the sealing layer 12 via the adhesive layer 4.

The phosphor layer 3 is provided so as to cover the light emitting diodes 11. To be specific, the phosphor layer 3 is provided so that the phosphor portions 5, in plane view, include the regions separated by the housing 15.

Next, as shown in phantom lines of FIG. 3(b), the release substrate 2 is peeled off from the surface (the upper surface) of the phosphor layer 3 and the surface (the upper surface) of the adhesive layer 4 exposed from each of the phosphor portions 5.

Thereafter, as shown in FIG. 3(c), the adhesive layer 4 is cured by heating. The heating temperature is, for example, 100 to 150° C.

In this way, the phosphor layer 3 is adhered to the upper surfaces of the housing 15 and the sealing layer 12 via the adhesive layer 4.

The adhesive layer 4 shrinks mainly in the thickness direction due to the above-described curing. The thickness (the height from the lower surface of the phosphor layer 3 to the upper surfaces of the housing 15 and the sealing layer 12) T2 of the adhesive layer 4 after the curing is, for example, 1 to 1000 μm, or preferably 15 to 80 μm.

Thereafter, as shown in FIG. 3(d), lenses 17 are provided on each of the phosphor portions 5. The lenses 17 are formed into a generally semi-sphere shape (generally dome shape) and are provided via a known adhesive layer (not shown) so as to cover above the sealing layer 12 that seals each of the light emitting diodes 11. The lenses 17 are formed from a transparent resin such as a silicone resin.

According to the above-described transfer sheet for the phosphor layer 1, the phosphor layer 3 can be easily adhered to the board 10 via the adhesive layer 4 by an easy method of transferring the phosphor layer 3 on the board 10.

Therefore, the light-emitting device 18 can be obtained by an easy method with excellent production costs.

FIG. 4 shows other process drawings for fabricating the transfer sheet for the phosphor layer. In FIG. 4, the same reference numerals are provided for members corresponding to each of those described above, and their detailed description is omitted.

In the above-described fabrication method of the transfer sheet for the phosphor layer 1 in FIG. 2, the phosphor layer 3 and the adhesive layer 4 are sequentially laminated on the release substrate 2. However, as shown in FIG. 4, the phosphor layer 3 and the adhesive layer 4 each are formed on the two release substrates respectively. Thereafter, the phosphor layer 3 and the adhesive layer 4 can be stuck together.

In this method, as shown in FIG. 4(a), a first release substrate 19 is first prepared. The first release substrate 19 is the same as the above-described release substrate 2.

Next, as shown in FIG. 4(b), the phosphor composition 8 is applied onto the first release substrate 19. Subsequently, after a solvent is removed by heating as required, as shown in FIG. 4(c), the phosphor layer 3 is formed.

Separately, as shown in FIG. 4(d), a second release substrate 20 is prepared. The second release substrate 20 is the same as the above-described release substrate 2.

Next, as shown in FIG. 4(e), the adhesive composition 9 is applied onto the second release substrate 20. Subsequently, after a solvent is removed by heating as required, as shown in FIG. 4(f), the adhesive layer 4 is formed on the second release substrate 20.

The adhesive layer 4 is formed on the entire upper surface of the second release substrate 20 excluding the circumference end portions thereof.

Thereafter, as shown in FIG. 4(g), the phosphor layer 3 and the adhesive layer 4 are stuck together.

In this way, the transfer sheet for the phosphor layer 1 including the phosphor layer 3, the first release substrate 19 formed on the surface (the upper surface) of the phosphor layer 3, the adhesive layer 4, and the second release substrate 20 formed on the back surface (the lower surface) of the adhesive layer 4 is formed.

Thereafter, in the transfer sheet for the phosphor layer 1, the second release substrate 20 is peeled off from the back surface (the lower surface) of the adhesive layer 4. Then, by using the transfer sheet for the phosphor layer 1, the phosphor layer 3 is transferred on the board 10.

In the above-described description, the phosphor layer 3 includes a plurality of the phosphor portions 5. However, though not shown, the phosphor layer 3 can include only one phosphor portion 5.

Preferably, the phosphor layer 3 includes a plurality of the phosphor portions 5 that are arranged in alignment in spaced relation to each other.

According to such arrangement, each of the regions separated by the housing 15 can be covered by the phosphor portions 5 that are independent to each other.

Each of the phosphor portions 5 is, compared to the case where each of the phosphor portions 5 is formed so as to continuously cover each of the regions described above, individually formed in a necessary part, so that the phosphor concentration of each of the phosphor portions 5 can be uniformized and the thickness thereof can be uniformized in comparison with the phosphor concentration and the thickness of the phosphor layer 3 that are continuously formed.

Therefore, uniform emission can be achieved. As a result, a light emission test of the light-emitting device 18 may be unnecessary, so that the production costs can be reduced.

Furthermore, the adhesive layer 4 is in contact with the upper surface of the release substrate 2 among each of the phosphor portions 5 that are arranged at spaced intervals, so that, when the phosphor layer 3 is transferred using the transfer sheet for the phosphor layer 1, the adhesive layer 4 among each of the phosphor portions 5 is adhered to the upper surface of the housing 15 that separates the light emitting diodes 11. Therefore, adhesive performance between the transfer sheet for the phosphor layer 1 and the board 10 can be improved. As a result, the light emitting diodes 11 are reliably covered with the phosphor layer 3, so that the light extraction efficiency of the white light can be improved.

In the above-described description, the sealing layer 12 is provided on the board 10. However, though not shown, for example, a region in which the light emitting diode 11 is housed can be formed into a hollow shape without providing the sealing layer 12.

In the above-described description, the lens 17 is provided in the light-emitting device 18. However, though not shown, for example, the light-emitting device 18 can be composed without providing the lens 17.

In the above-described description, the light emitting diodes 11 are electrically connected (wire bonding) to the conductive pattern 14 via the wire 16. However, though not shown, for example, a terminal is formed on the lower surface of the light emitting diodes 11, and the formed terminal can be electrically connected (flip chip bonding) to the terminal of the conductive pattern 14 by solder and the like without using the wire 16.

EXAMPLES

While the present invention will be described hereinafter in further detail with reference to Examples, the present invention is not limited to these Examples.

Example 1

(Fabrication of Transfer Sheet for Phosphor layer)

A release substrate composed of polyethylene terephthalate having a thickness of 50 μm was prepared (ref: FIG. 2(a)).

26 parts by mass of phosphor particles composed of $Y_3Al_5O_{12}$:Ce (sphere shape, the average particle size of 8 μm) and 74 parts by mass of a silicone resin (addition reaction type silicone resin, kinetic viscosity (25° C.): 20 mm$^2$/s, manufactured by WACKER ASAHIKASEI SILICONE CO., LTD.) were blended and stirred uniformly, thereby preparing a phosphor composition.

Next, the prepared phosphor composition was applied onto a release substrate by the printing method (ref: FIG. 2(b)). In the printing method, the screen of the above-described pattern was first placed on the release substrate and then the phosphor composition was printed with a squeegee via the screen. Thereafter, the screen was lifted from the release substrate to be dried at 100° C., so that a phosphor layer having a thickness of 75 μm and including a plurality of phosphor portions arranged in alignment was formed (ref: FIG. 2(c)).

Separately, 50 parts by mass of an epoxy resin (bisphenol A epoxy resin, epoxy equivalent of 600 g/eqiv., viscosity (25° C.) of 2000 mPa·s, manufactured by Tohtokasei Co., Ltd.) and 30 parts by mass of a curing agent (acid anhydride compound, manufactured by New Japan Chemical co., ltd.) were blended and stirred uniformly, thereby preparing an epoxy adhesive composition.

Next, a frame member was placed on the circumference end portions of the release substrate. Then, the prepared epoxy adhesive composition was printed with the squeegee (ref: FIG. 2(d)). Thereafter, the frame member was lifted from the release substrate to be dried at 100° C., so that an adhesive layer having a thickness (T1) of 67 μm was formed (ref: FIG. 2(e)).

A transfer sheet for a phosphor layer was fabricated in this manner (ref: FIG. 1).

(Fabrication of Light-Emitting Device)

A board including a base board, a conductive pattern, and a housing; and a blue light emitting diode were prepared (ref: FIG. 3(a)). The blue light emitting diode was sealed by a sealing layer after wire bonding to the conductive pattern via a wire.

Next, a phosphor layer was transferred on the board using the transfer sheet for the phosphor layer that was fabricated above (ref: FIG. 3(b)).

That is, the surface of the adhesive layer of the transfer sheet for the phosphor layer was allowed to come into close contact with the upper surface of the housing on the board and the upper surface of the sealing layer, so that the phosphor layer was attached to the upper surfaces of the housing and the sealing layer via the adhesive layer so as to cover the blue light emitting diode.

Next, the release substrate was peeled off (ref: phantom lines of FIG. 3(b)).

Thereafter, the adhesive layer was cured by heating at 150° C. (ref: FIG. 3(c)). The thickness (T2) of the adhesive layer after the curing was 40 μm.

Thereafter, lenses each having a dome shape were provided via an adhesive layer (silicone based). The light-emitting device was fabricated in this manner.

(Evaluation)

(Measurement of Refractive Index)

The refractive index (n1) of the phosphor layer and the refractive index (n2) of the adhesive layer in the transfer sheet for the phosphor layer were measured. The results thereof were 1.41 and 1.58, respectively. The refractive index was measured in conformity with the description of JIS K 7142.

TABLE 1

| Refractive Index | Example 1 |
| --- | --- |
| Phosphor Layer n1 | 1.41 |
| Adhesive Layer n2 | 1.58 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A transfer sheet for a phosphor layer comprising:
   a release substrate;
   a phosphor layer formed so as to be in direct contact with an upper surface of the release substrate; and
   an adhesive layer made of an adhesive composition before being cured by heating and formed on the release substrate so as to cover the phosphor layer.

2. The transfer sheet for the phosphor layer according to claim 1, wherein the phosphor layer includes a plurality of phosphor portions that are arranged in alignment in spaced relation to each other, and
   the adhesive layer covers an upper surface and a side surface of each of the plurality of phosphor portions and is in contact with the upper surface of the release substrate among each of the phosphor portions.

3. The transfer sheet for the phosphor layer according to claim 1, wherein the refractive index of the adhesive layer is higher than that of the phosphor layer.

4. A light-emitting device comprising:
a board;
a light emitting diode provided on the board; and
a phosphor layer provided on the board so as to cover the light emitting diode; wherein
the phosphor layer is adhered onto the board via an adhesive layer by allowing the phosphor layer to be transferred on the board using a transfer sheet for a phosphor layer including a release substrate, the phosphor layer formed so as to be in direct contact with an upper surface of the release substrate, and the adhesive layer made of an adhesive composition before being cured by heating and formed on the release substrate so as to cover the phosphor layer.

5. The light-emitting device according to claim 4, wherein the board comprises a base board and a housing provided to stand upward from an upper surface of the base board and arranged so as to surround each light emitting diode one by one, the light emitting diode is each arranged in each region separated by the housing, the phosphor layer comprises a plurality of phosphor portions that are arranged in alignment in spaced relation to each other, the adhesive layer covers an upper surface and a side surface of each of the plurality of phosphor portions and is in contact with an upper surface of the release substrate between the plurality of phosphor portions, and when transferring the transfer sheet for the phosphor layer, a surface of the adhesive layer is transferred onto a surface of the housing of the board such that each of the phosphor portions corresponds to each of the regions separating each of the light emitting diodes and the phosphor portions one-to-one correspond to the light emitting diodes.

* * * * *